United States Patent [19]

Hisamoto et al.

[11] Patent Number: 4,578,209

[45] Date of Patent: Mar. 25, 1986

[54] COMPOSITION FOR CLEANING SURFACE OF SUBSTRATE

[75] Inventors: Iwao Hisamoto, Suita; Yukio Omure, Takatsuki, both of Japan

[73] Assignee: Daikin Kogyo Co., Ltd., Osaka, Japan

[21] Appl. No.: 703,456

[22] Filed: Feb. 20, 1985

Related U.S. Application Data

[63] Continuation of Ser. No. 497,724, May 24, 1983, abandoned.

[30] Foreign Application Priority Data

May 24, 1982 [JP] Japan ................................ 57-88692

[51] Int. Cl.⁴ .......................... C11D 3/43; C11D 7/50
[52] U.S. Cl. ................................... 252/143; 252/151; 252/162; 252/170; 252/171; 252/172; 252/554; 252/556; 252/558; 156/344

[58] Field of Search ............... 252/143, 151, 158, 162, 252/170, 171, 172, 527, 554, 80, 82, 556; 156/664, 668, 344

[56] References Cited

U.S. PATENT DOCUMENTS 3,871,929  3/1975  Schevey et al. ................... 252/171
4,187,191  2/1980  Simpson, Jr. ..................... 252/143
4,242,218 12/1980  Vander Mey ..................... 252/162

FOREIGN PATENT DOCUMENTS 131099 11/1980 Japan .

Primary Examiner—Lorenzo B. Hayes
Assistant Examiner—Hoa Van Le
Attorney, Agent, or Firm—Armstrong, Nikaido, Marmelstein & Kubovcik

[57] ABSTRACT

The present invention relates to a composition for cleaning a surface of a substrate, which contains as main components, (a) a halogenated hydrocarbon solvent, (b) a fluorine-containing alcohol and (c) an organic acid.

1 Claim, 5 Drawing Figures

COMPOSITION FOR CLEANING SURFACE OF SUBSTRATE

This application is a continuation of application Ser. No. 497,724, filed May 24, 1983, now abandoned.

BACKGROUND OF THE INVENTION

The present invention relates to a composition for cleaning a surface of a substrate, more particularly relates to a composition containing as main components a halogenated hydrocarbon solvent, a fluorine-containing alcohol and an organic acid.

Stains such as paints, printing inks, abrasives, resin films of sintered fluxes and other resinous materials formed on a surface of a substrate are removed from the substrate, in general, by wiping the surface of the substrate with a cloth which is soaked with solvent or by immersing the substrate into an inorganic strong acid or alkali to dissolve or peel off the stains. The both treatments, however, have the following defects. In the physically wiping treatment much labor and time is required, and in the immersing treatment the inorganic strong acid or alkali injures the substrate and is dangerous to handle.

In the electronic industry, a resist film is removed from a substrate by using a cleaning composition containing an aromatic sulfonic acid, a halogenated hydrocarbon and, if necessary, a phenol. Although the composition can peel off the film, the rate of peeling off is low, and also when the composition is adapted to a substrate having a fine resist pattern thereon the resist film cannot be completely peeled off at very fine portions.

An object of the present invention is to provide a composition for cleaning a surface of a substrate which has a resin film thereon or is stained with a resinous material.

Another object of the present invention is to provide a composition for completely removing a resist film having a fine resist pattern from a surface of a substrate in a short time.

SUMMARY OF THE INVENTION

The present invention relates to a composition for cleaning a surface of a substrate, which contains as main components (a) a halogenated hydrocarbon solvent, (b) a fluorine-containing alcohol and (c) an organic acid.

DETAILED DESCRIPTION

Figure 1:
FIGS. 1 to 3 show sketchy views of the substrates from which the resist films are removed by using the compositions prepared in Examples 3 to 5, respectively.

As the halogenated hydrocarbon solvent (component (a)) in the invention, an aliphatic or aromatic hydrocarbon substituted by at least one chlorine atom, fluorine atom or bromine atom can be employed. The halogenated aliphatic hydrocarbon preferably has 1 to 4 carbon atoms. Examples of the halogenated hydrocarbon are, for instance, halogenated aliphatic hydrocarbons such as methylene chloride, chloroform, 1,1-dichloroethane, 1,2-dichloroethane, 1,1,1-trichloroethane, trichloroethylene, perchloroethylene, trichloromonofluoromethane, tetrachlorodifluoroethane, trichlorotrifluoroethane, dibromotetrafluoroethane, 1,3-dichloropropane, 2,2-dichloropropane, 1,3-dichlorobutane and 1,4-dichlorobutane; halogenated aromatic hydrocarbons such as o-dichlorobenzene, m-dichlorobenzene, trichlorobenzene, chlorotoluene, benzotrifluoride and o-chlorobenzotrifluoride. These compounds may be employed alone or in admixture thereof.

The fluorine-containing alcohol (component (b)) in the present invention is a saturated or unsaturated fluorine-containing alcohol which may have a side chain and/or an other bond. Examples of the fluorine-containing alcohol are, for instance, compounds represented by the formulas:

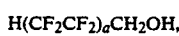
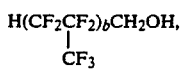
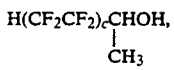
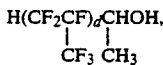
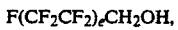
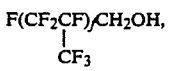
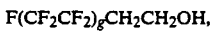
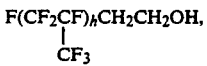
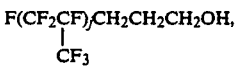

$H(CFClCF_2)_kCH_2OH,$
$H(CF_2CF_2)_lC(CH_3)_2OH,$
$H(CF_2CF_2)_mC(C_3H_7)HOH,$
$CF_3CF_2O(CF_2CF_2O)_nCF_2CH_2OH,$
$CF_3CF_2CF_2O[CF(CF_3)CF_2O]_oCF(CF_3)CH_2OH,$
$(CF_3)_2CF(CF_2CF_2)_pCH=CHCH_2OH,$
$HOCH_2(CF_2CF_2)_qCH_2OH,$
$HOCH_2CH_2(CF_2CF_2)_rCH_2CH_2OH,$
$HOCH_2CF_2CFH(CF_2CF_2)_sCFHCF_2CH_2OH$
and
$HOCH_2CF_2CH_2(CF_2CF_2)_tCH_2CF_2CH_2OH$ wherein each of a, c, e, g and i is an interger of 1 to 5 and each of b, d, f, h and j to t is an integer of 1 to 3. These compounds may be employed alone or in admixture thereof.

The organic acid (component (C)) employed in the present invention is an aliphatic or aromatic sulfonic acid, an aliphatic or aromatic ester, an aliphatic or aromatic carboxylic acid or the like. Examples of the organic acid are, for instance, aliphatic sulfonic acids such as decanesufonic acid, dodecanesulfonic acid and di-2-ethylhexylsulfosuccinic acid; aromatic sulfonic acids such as benzenesulfonic acid, heptylbenzenesulfonic acid, octylbenzenesulfonic acid, decylbenzenesulfonic acid, dodecylbenzenesulfonic acid, cumenesulfonic acid, toluenesulfonic acid, naphthalenesulfonic acid, xylenesulfonic acid, methylbenzenesulfonic acid, naphtholsulfonic acid, phenolsulfonic acid, cresolsulfonic acid, chloronaphtholsulfonic acid, chlorophenolsulfonc acid, chlorobenzenesulfonic acid, phenol-2,4-disulfonic acid, p-aminobenzenesulfonic acid and biphenylsulfonic acid; aliphatic sulfonates such as a dodecylsulfonate and a dodecanesulfonate; aromatic sulfonates such as a toluenesulfonate and a dodecylbenzenesulfonate; aliphatic carboxylic acids such as acetic acid, propionic acid, lauric acid, oleic acid, linoleic acid, adipic acid, maleic acid, hydroxyacetic acid, acetoacetic acid, aminoacetic acid, hydroxyphenylacetic acid, monochloroacetic acid, trichloroacetic acid, $H(CF_2CF_2)COOH$, $H(CF_2CF_2)_3COOH$, $H(CF_2CF_2)_4COOH$, $F(CF_2CF_2)_3COOH$ and $CF_3CF_2OCF_2CF(CF_3)COOH$; aromatic carboxylic acids such as benzoic acid, phtahlic acid, hydroxybenzoic acid, sulfobenzoic acid, 2-hydroxy-5-sulfobenzoic acid, naphthalenecarboxylic acid and chlorophthalic acid. These compounds may be employed alone or in admixture thereof.

The components (a), (b) and (c) can be admixed in various range, in general in a range within which the components (a), (b) and (c) are compatible with each other. When a weight ratio of the components (a)/(b)/(c) is within a range of 20 to 70/5 to 40/5 to 80, the effect of removing stains by peeling off or dissolution particularly increases regardless of the kinds of applied or deposited resinous materials, and thus an excellent surface cleaning effect can be obtained. When the weight ratio of the components (a)/(b)/(c) is outside 20 to 70/5 to 40/5 to 80, the stains to be removed might be limited in relation to kinds of resinous materials of the stains and their depositing conditions. When the components (a) and (b) or (a), (b) and (c) form an azeotropic mixture, the composition of the present invention can be desirably empolyed because such composition can be easily recovered and used again.

The stained surface off the substrate to be treated can be easily cleaned by immersing the substrate into the composition of the invention or by wiping the surface of the substrate after spraying, applying or spreading the composition to the substrates. Preferably the substrate is treated by immersing or ultrasonic cleaning. The treatments can be carried out at a temperature from room temperature to an elevated temperature, in general up to a boiling point of the composition.

With the composition of the present invention, if necessary, other solvents, surfactants, stabilizers and the like may be admixed. Examples of the solvent are, for instance, benzene, toluene, xylene, trimethylbenzene, ethylbenzene, diethylbenzene, triethylbenzene, octylbenzene, decylbenzene, dodecylbenzene, tridecylbenzene, cumene, tridecyltoluene, phenol, cresol, resorcinol, pentane, hexane, acetone, methyl ethyl ketone, methyl isobutyl ketone, etoxyethanol, ethylene glycol monoalkyl ether, tetrahydrofuran, nitromethane, formamide, dimethylformamide, dimethylacetamide, N-methylpyrrolidone, acetonitrile, propionitrile, malonitrile, succinonitrile, glutaronitrile, adiponitrile tetramethylenesulfone, and an admixture thereof.

As the surfactant, a cationic surfactant, an anionic surfactant and the like can be optionally employed. Examples of the surfactant are, for instance, alkylbenzenesulfonic acid salts, dialkylsulfosuccinic acid salts, alkylsulfuric acid salts, alkyltrimethyl quaternary ammonium salts, organoic acid salts of di or monoalkylamine, alkylbentaines, alkylimidazolines, polyoxyethylene alkyl ethers, polyoxyethylenesorbitan esters, polyoxyethylenealiphatic acid esters and the like.

The solvent, surfactant and stabilizer may be usually admixed, respectively, in an amount of not more than 40 parts by weight on the basis of 100 parts by weight of the mixture of the components (a), (b) and (c).

The composition of the present invention can rapidly and completely clean the surface of substrate by peeling off or dissolving stains which are mainly formed of resin films or resinous materials. The cleaning effect of the composition can be particularly obtained in case of electronic parts having a fine resist pattern. Furthermore the composition of the invention can peel off or dissolve stains such as solid, oily and tarry carbon which can hardly be removed by using usual cleaning agents.

The present invention is more specifically described and explained by means of the following Examples. These Examples are intended to illustrate the present invention and are not to be constructed to limit the scope of the invention.

EXAMPLE 1

1,1,2-Trichloro-1,2,2-trifluoroethan (flon-113), methylene chloride, $H(CF_2CF_2)CH_2OH$ and dodecylbenzenesulfonic acid (DBS) were admixed in a weight ratio of 35:35:10:20 to obtain the composition of the present invention.

The removing effect of the composition was examined by immersing an iron plate (2 mm × 5 mm) coated with an alkyl resin paint available from Shinto Paints Co., Ltd. under the trade designation "Alkys #200" into 100 ml of the composition at room temperature and measuring a time required in completely peeling off (hereinafter referred to as "peeling off time"). The result is shown in Table 1.

EXAMPLE 2 AND COMPARATIVE EXAMPLES 1 TO 3

After preparing the compositions shown in Table 1, with respect to each composition a peeling off time was measured in the same manner as in Example 1. The results are shown in Table 1.

TABLE 1

|  | Components of composition (weight ratio) | Peeling off time |
| --- | --- | --- |
| Example 1 | Flon-113/methylene chloride/$H(CF_2CF_2)CH_2OH$/DBS (35/35/10/20) | 50 seconds |
| Example 2 | Methylene chloride/$H(CF_2CF_2)CH_2OH$/DBS (75/5/20) | 65 seconds |
| Comparative Example 1 | Methylene chloride/DBS (80/20) | 115 seconds |
| Comparative Example 2 | Methylene chloride/$H(CF_2CF_2)CH_2OH$ (94/6) | 120 seconds |
| Comparative Example 3 | Perchloroethylene/trichloroethylene/$H(CF_2CF_2)CH_2OH$ (43.5/43.5/13) | 130 seconds |

EXAMPLE 3

A photosensitive solution (for negative resist) containing polyisobutylene was applied to a silicate substrate and dried to form a resist film, and then the substrate was baked for 40 minites at 220° C.

The baked substrate was immersed into the composition of the invention which was prepared by admixing perchloroethylene, H(CF$_2$CF$_2$)CH$_2$OH and DBS in a weight ratio of 60:10:30 for 5 minutes at 100° C., washed with isopropanol, and then washed with trichlorotrifluoroethane.

FIG. 1 shows the sketchy view of the surface of the washed substrate observed by means of a microscope (1000 magnifications).

EXAMPLES 4 TO 5 AND COMPARATIVE EXAMPLES 4 TO 5

After preparing the compositions shown in Table 2, the procedures in Example 3 were repeated to peel off the resist film. FIGS. 2 to 5 show the sketchy views of the surfaces of the substrates after being peeled off by using the composition prepared in Examples 4 to 5 and Comparative Examples 4 to 5, respectively, which were observed by means of a microscope (1000 magnifications).

TABLE 2

| | Components of composition (weight ratio) |
|---|---|
| Example 4 | o-Dichlorobenzene/perchloroethylene/ H(CF$_2$CF$_2$)CH$_2$OH/DBS/phenol (27/32/10/18/13) |
| Example 5 | o-Dichlorobenzene/perchloroethylene/ H(CF$_2$CF$_2$)$_2$CH$_2$OH/DBS (32/37/10/21) |
| Comparative Example 4 | Perchloroethylene/H(CF$_2$CF$_2$)CH$_2$OH (85/15) |
| Comparative Example 5 | o-Dichlorobenzene/perchloroethylene/ DBS/phenol (30/35/20/15) |

Figure 2:
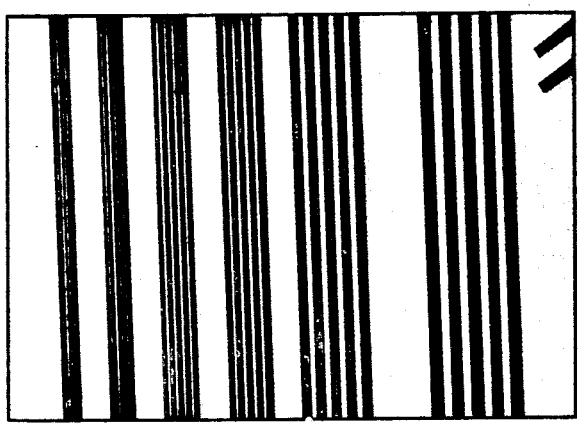
Figure 3:
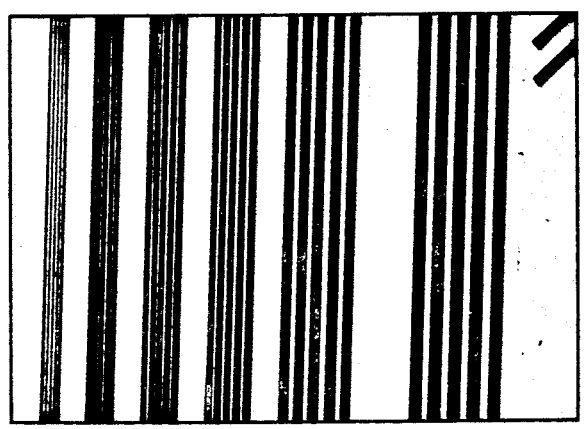
Figure 4:
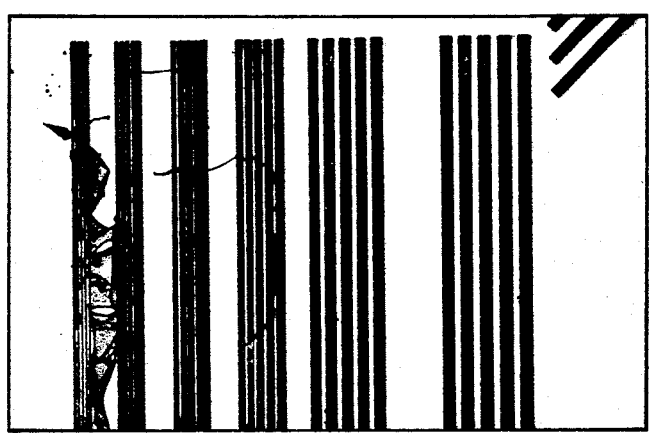
FIGS. 4 to 5 show sketchy views of the substrates from which the resist films are removed by using the compositions prepared in Comparative Examples 4 to 5, respectively.
Figure 5:

As is clear from FIGS. 1 to 3, the resist films were completely peeled off by using the compositions of the present invention, but as is clear form FIGS. 4 to 5, the resist films were not satisfactorily peeled off at very fine portions.

EXAMPLE 6

A resist pattern was formed on a flexible board by using a dry film resist of a copolymer mainly containing an acrylate to prepare a flexible printed circuit board. A peeling off time of the resist was measured by immersing the board into the composition prepared in Example 1 at room temperature (25° C.). The result was shown in Table 3.

EXAMPLE 7 AND COMPARATIVE EXAMPLES 6 TO 8

After preparing the compositions shown in Table 3, with respect to each composition a peeling off time was measured by repeating the procedure in Example 6. The results are shown in Table 3.

TABLE 3

| | Components of composition (weight ratio) | Peeling off time |
|---|---|---|
| Example 6 | Flon-113/methylene chloride/H(CF$_2$CF$_2$)CH$_2$OH/ DBS (35/35/10/20) | 130 seconds |
| Example 7 | Methylene chloride/H(CF$_2$CF$_2$)$_2$CH$_2$OH/DBS (75/5/20) | 150 seconds |
| Comparative Example 6 | Methylene chloride/DBS (80/20) | 380 seconds |
| Comparative Example 7 | Methylene chloride/H(CF$_2$CF$_2$)$_2$CH$_2$OH (94/6) | 390 seconds |
| Comparative Example 8 | Perchloroethylene/trichloroethylene/ H(CF$_2$CF$_2$)CH$_2$OH (43.5/43.5/13) | 405 seconds |

As is clear from Table 3, the composition of the present invention can rapidly peel off the resist from the printed circuit board.

As a result of observing the surfaces of the boards by means of a microscope, when the compositions of the present invention were used the resists were completely removed even at very fine portions, but when the compositions prepared in Comparative Examples 6 to 8 were used there still remained non-peeled portions.

What is claimed is:

1. A composition for cleaning a surface of a substrate consisting essentially of: (a) a halogenated hydrocarbon solvent selected from the group consisting of; an aliphatic hydrocarbon substituted by at least one chlorine atom, an aliphatic hydrocarbon substituted by at least one fluorine atom, an aliphatic hydrocarbon substituted by at least one bromine atom, an aromatic hydrocarbon substituted by at least one chlorine atom, an aromatic hydrocarbon substituted by at least one fluorine atom, an aromatic hydrocarbon substituted by at least one bromine atom, and mixtures of the above recited halogenated hydrocarbon compounds, (b) a fluorine-containing alcohol selected from the group consisting of;

$H(CF_2CF_2)_aCH_2OH$, $H(CF_2CF_2)_bCH_2OH$, $H(CF_2CF_2)_cCHOH$,
$\phantom{H(CF_2CF_2)_c}CH_3$ $H(CF_2CF)_dCHOH$,
$CF_3\phantom{(CF_2CF)_d C}CH_3$ $F(CF_2CF_2)_eCH_2OH$, $F(CF_2CF_2)_fCH_2OH$,
$\phantom{F(CF_2CF_2)_f}CF_3$ $F(CF_2CF_2)_gCH_2CH_2OH$, $F(CF_2CF)_hCH_2CH_2OH$,
$\phantom{F(CF_2CF)_h}CF_3$ $F(CF_2CF_2)_iCH_2CH_2CH_2OH$, -continued F(CF$_2$CF)$_j$CH$_2$CH$_2$CH$_2$OH,
    |
    CF$_3$ H(CFClCF$_2$)$_k$CH$_2$OH,
H(CF$_2$CF$_2$)$_l$C(CH$_3$)$_2$OH,
H(CF$_2$CF$_2$)$_m$C(C$_3$H$_7$)HOH,
CF$_3$CF$_2$O(CF$_2$CF$_2$O)$_n$CF$_2$CH$_2$OH,
CF$_3$CF$_2$CF$_2$O[CF(CF$_3$)CF$_2$O]$_o$CF(CF$_3$)CH$_2$OH,
(CF$_3$)$_2$CF(CF$_2$CF$_2$)$_p$CH=CHCH$_2$OH,
HOCH$_2$(CF$_2$CF$_2$)$_q$CH$_2$OH, -continued HOCH$_2$CH$_2$(CF$_2$CF$_2$)$_r$CH$_2$CH$_2$OH,
HOCH$_2$CF$_2$CFH(CF$_2$CF$_2$)$_s$CFHCF$_2$CH$_2$OH,
HOCH$_2$CF$_2$CH$_2$(CF$_2$CF$_2$)$_t$CH$_2$CF$_2$CH$_2$OH, and mixtures of the above-recited alcohols, wherein each of a, c, e, g and i is an interger of 1 to 5 and each of b, d, f, h and j to t is an integer of 1 to 3, and (c) an organic acid selected from the group consisting of; an aliphatic sulfonic acid, an aromatic sulfonic acid, and mixtures of the above-recited organic acids in a weight ratio within a range of 20 to 75/5 to 40/5 to 75.

* * * * *